United States Patent
Kim et al.

(10) Patent No.: US 8,262,934 B2
(45) Date of Patent: Sep. 11, 2012

(54) SILICATE PHOSPHOR AND WHITE LIGHT EMITTING DEVICE INCLUDING THE SAME

(75) Inventors: Tae-gon Kim, Yongin-si (KR);
Seoung-jae Im, Yongin-si (KR);
Shunichi Kubota, Yongin-si (KR);
Young-sic Kim, Yongin-si (KR)

(73) Assignee: Samsung Electro-Mechanics Co., Ltd. (KR)

( * ) Notice: Subject to any disclaimer, the term of this patent is extended or adjusted under 35 U.S.C. 154(b) by 822 days.

(21) Appl. No.: 12/139,055

(22) Filed: Jun. 13, 2008

(65) Prior Publication Data

US 2009/0130484 A1   May 21, 2009

(30) Foreign Application Priority Data

Nov. 21, 2007  (KR) .................. 10-2007-0119311

(51) Int. Cl.
  *C09K 11/08*  (2006.01)
  *C09K 11/66*  (2006.01)
(52) U.S. Cl. ................ 252/301.4 F; 252/301.4 H
(58) Field of Classification Search ............ 252/301.4 F, 252/301.4 R, 301.6 R, 301.6 F, 301.4 H
See application file for complete search history.

(56) References Cited

U.S. PATENT DOCUMENTS 7,431,864 B2 * 10/2008 Hirosaki ............... 252/301.4 R
2010/0155753 A1 * 6/2010 Imanari et al. ............... 257/98

FOREIGN PATENT DOCUMENTS

| CN | 1544575 A | * | 11/2004 |
| CN | 101054520 A | * | 10/2007 |
| KR | 10-2001-0026297 A | * | 4/2001 |
| WO | WO 2006090865 A1 | * | 8/2006 |

OTHER PUBLICATIONS

M. Pardha Saradhi et al., Photoluminescence Studies on Eu2+-Activated Li2SrSiO4—a Potential Orange-Yellow Phosphor for Solid-State Lighting, Oct. 3, 2006, pp. 5267-5272, vol. 18, No. 22, Chem. Mater.
Kenji Toda et al., New Silicate Phosphors for a White LED, Oct. 2006, pp. 1406-1412, vol. E89-C, No. 10, IEICE Trans. Electron.

* cited by examiner

*Primary Examiner* — Emily Le
*Assistant Examiner* — Lynne Edmondson
(74) *Attorney, Agent, or Firm* — Cantor Colburn LLP

(57) ABSTRACT

Disclosed is a silicate phosphor represented by Formula: $Li_{a-x}A_xSr_{b-y-z-t}B_yEu_zC_tSi_{c-m}D_mO_{d-n}E_n$ where A includes at least one ion selected from the group consisting of Na, K, Rb, and Cs. B includes at least one ion selected from the group consisting of Mg, Ca, Ba and Zn. C includes at least one ion selected from the group consisting of Sc, Y, La, Gd, Ce, Pr, Nd, Sm, Tb, Dy, Ho, Er, Tm, Yb, Lu and Bi. D includes at least one ion selected from the group consisting of B, Al, Ga, In and Tl. E includes at least one ion selected from the group consisting of F, Cl, Br, and I. Further disclosed is a white light emitting device including the silicate phosphor.

16 Claims, 4 Drawing Sheets

SILICATE PHOSPHOR AND WHITE LIGHT EMITTING DEVICE INCLUDING THE SAME

This application claims priority to Korean Patent Application No. 10-2007-0119311, filed on Nov. 21, 2007, and all the benefits accruing therefrom under 35 U.S.C. §119, the contents of which in its entirety is incorporated herein by reference.

BACKGROUND OF THE INVENTION

This disclosure relates to a silicate phosphor and a white light emitting device that uses the silicate phosphor.

A conventional optical system may include fluorescent lamps and incandescent lamps. Fluorescent lamps, however, cause environmental problems due to mercury (Hg) contained therein. In addition, such conventional optical systems have very short lifetimes and because they operate at a low efficiency, they do not save much energy. Therefore, much research is being performed to develop white light emitting devices that operate at a high efficiency.

Such white light emitting devices can produce white light using three methods as follows. Red, green and blue phosphors can be excited by a UV light emitting diode (LED) that acts as a light source to produce white light, red and green phosphors can be excited by a blue LED that acts as a light source to produce white light, or a yellow phosphor can be excited by a blue LED that acts as a light source to produce white light.

Specifically, the method of producing white light by exciting a yellow phosphor by a blue LED is problematic in terms of color production because the intensity of red light contained in the white light is decreased.

Therefore, research into optical systems that use the other two methods, that is, the method that uses the UV LED and red, green and blue phosphors and the method that uses the blue LED and red and green phosphors, is being actively performed. These methods can produce excellent color properties but only at a low efficiency.

Commercially available red phosphors are not very suitable for a white light emitting device. They show excellent emission efficiency with respect to cathode rays, vacuum ultraviolet rays (VUV) and short waves, but low emission efficiency with respect to UV and blue light used in white light emitting devices. Therefore, there is a need to develop a red phosphor having high emission efficiency with respect to UV and blue light in the technical field of white light emitting devices.

In view of the above, a silicate-based phosphor has been developed. For example, Chem. Mater., Vol. 18, 5267 (2006), IEICE Trans. Electron. Vol. E89-C, 1406 (2006) discloses a white light emitting device including $Li_2SrSiO_4$:Eu as an orange-yellow phosphor which is excited by a blue LED light source to produce white light.

SUMMARY OF THE INVENTION

Disclosed herein is a silicate phosphor having a high color index and excellent light efficiency.

Disclosed herein too is a white light emitting device that comprises the silicate phosphor.

Disclosed too is a silicate phosphor represented by Formula 1:

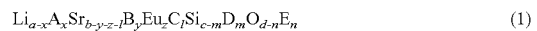
(1)

where A includes at least one ion selected from the group consisting of Na, K, Rb, and Cs; B includes at least one ion selected from the group consisting of Mg, Ca, Ba and Zn; C includes at least one ion selected from the group consisting of Sc, Y, La, Gd, Ce, Pr, Nd, Sm, Tb, Dy, Ho, Er, Tm, Yb, Lu and Bi; D includes at least one ion selected from the group consisting of B, Al, Ga, In and Tl; E includes at least one ion selected from the group consisting of F, Cl, Br, and I; $1.5 \leq a \leq 2.5$; $1.5 \leq b \leq 2.5$; $1.5 \leq c \leq 2.5$; $3 \leq d \leq 5$; $0 \leq x < 2$; $0 \leq y < 1$; $0 < z \leq 0.1$; $0 < l \leq 0.1$; and $0 \leq m \leq 0.1$ and $0 \leq n \leq 1$, in which when $x = y = 0$, $0 \leq m \leq 0.1$.

Disclosed is a white light emitting device including a UV light emitting diode (LED); and the silicate phosphor.

Disclosed is a white light emitting device including a blue LED; and the silicate phosphor.

BRIEF DESCRIPTION OF THE DRAWINGS

The above and other features and advantages of the disclosed embodiments will become more apparent by describing in detail exemplary embodiments thereof with reference to the accompanying drawings, in which.

DETAILED DESCRIPTION OF THE EXEMPLARY EMBODIMENTS

Figure 1:
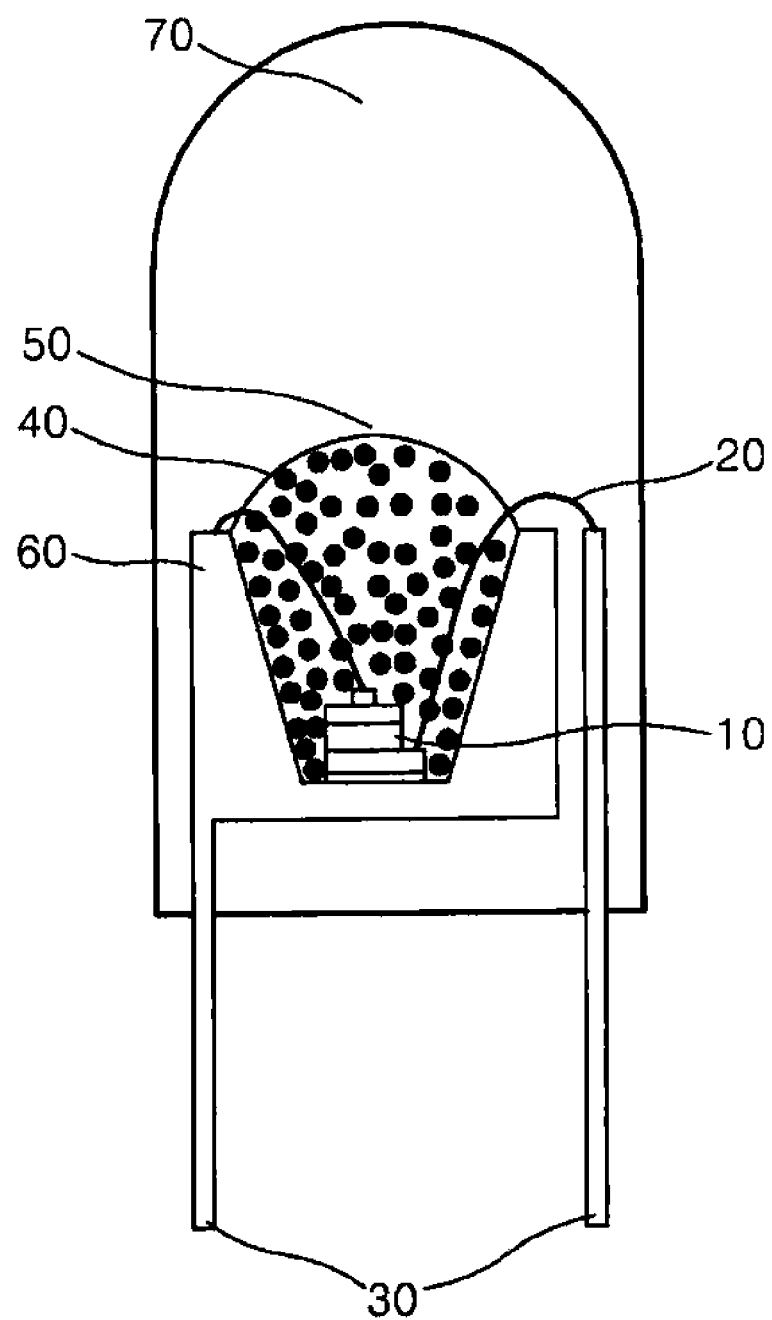
FIG. 1 illustrates the exemplary structure of a light emitting diode (LED)

Disclosed embodiments will now be described more fully with reference to the accompanying drawings, in which exemplary embodiments are shown.

It will be understood that when an element is referred to as being "on" another element, it can be directly on the other element or intervening elements may be present therebetween. In contrast, when an element is referred to as being "disposed on" or "formed on" another element, the elements are understood to be in at least partial contact with each other, unless otherwise specified.

The terminology used herein is for the purpose of describing particular embodiments only and is not intended to be limiting of the invention. As used herein, the singular forms "a", "an" and "the" are intended to include the plural forms as well, unless the context clearly indicates otherwise. The use of the terms "first", "second", and the like do not imply any particular order, but are included to identify individual elements. It will be further understood that the terms "comprises" and/or "comprising", or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the drawings, like reference numerals in the drawings denote like elements and the thicknesses of layer and regions are exaggerated for clarity.

In one exemplary embodiment, a silicate phosphor may be represented by Formula 1.

$$Li_{a-x}A_xSr_{b-y-z-l}B_yEu_zC_lSi_{c-m}D_mO_{d-n}E_n \qquad \text{<Formula 1>}$$

where A includes at least one ion selected from the group consisting of Na, K, Rb, and Cs; B includes at least one ion selected from the group consisting of Mg, Ca, Ba and Zn; C includes at least one ion selected from the group consisting of Sc, Y, La, Gd, Ce, Pr, Nd, Sm, Tb, Dy, Ho, Er, Tm, Yb, Lu, and Bi; D includes at least one ion selected from the group consisting of B, Al, Ga, In and Tl; E includes at least one ion selected from the group consisting of F, Cl, Br, and I; $1.5 \leq a \leq 2.5$; $1.5 \leq b \leq 2.5$; $1.5 \leq c \leq 2.5$; $3 \leq d \leq 5$; $0 \leq x < 2$; $0 \leq y < 1$; $0 < z \leq 0.1$; $0 < l \leq 0.1$; and $1 < m \leq 0.1$ and $0 \leq n \leq 1$, in which when $x=y=0$, $0 \leq m \leq 0.1$.

The silicate phosphor represented by Formula 1 can be excited by UV and blue light. Therefore, a white light emitting device including the silicate phosphor represented by Formula 1 can be excited by a UV-light emitting diode (LED) and a blue-LED.

The silicate phosphor represented by Formula 1 can absorb light having a wavelength of about 300 nm to about 500 nm depending upon a composition of metal ions; the metal ions being elements represented by A, B, C, D and E of Formula 1. The silicate phosphor emits visible light having a wavelength of about 520 nm to about 600 nm. Therefore, the silicate phosphor represented by Formula 1 has excellent light emitting properties from green to orange. In an embodiment, the silicate phosphor can emit light having a wavelength of 580 nm or more, and thus the silicate phosphor is very suitable for producing white light having a high color rendering index. White illuminations having a high color rendering index are used in medical applications, food exhibitions, museums, and high-quality lifestyle illuminating applications.

Also, since the silicate phosphor represented by Formula 1 can absorb light having a wavelength of about 300 nm to about 500 nm, it can be used in a white light emitting device that uses a UV LED as a light source. In particular, it can be used as a UV LED to illuminate and to excite red, green and blue phosphors that emit red, green, and blue light respectively. The red, green and blue light then interact to produce white light. Also, the silicate phosphor represented by Formula 1 can be used in a white light emitting device in which a yellow phosphor is excited by a blue LED acting as a light source to produce white light. A white light emitting device including the silicate phosphor represented by Formula 1 has excellent white light emitting properties and high efficiency.

In an embodiment, in Formula 1, C can be Ce. In an embodiment, D can be Al.

The silicate phosphor represented by Formula 1 can have higher light emitting efficiency when the sum of Eu and Ce is equal to or smaller than a predetermined amount. For example, the sum of Eu and Ce (i.e., z+l) may be in the such range as: $0 < z+l \leq 0.05$.

In an embodiment, the silicate phosphor represented by Formula 1 can be $Li_2Sr_{1-p-q}Eu_pCe_qSi_{1-q}Al_qO_4$ or $Li_{2-q}Sr_{1-p-q}Eu_pCe_qSiO_4$ where $0 < p+q \leq 0.05$.

The silicate phosphor represented by Formula 1 can be prepared using various known methods, such as a solid phase method, a liquid phase method, or a vapor phase method.

When the silicate phosphor represented by Formula 1 is prepared using a solid phase method, first, precursors of the respective elements of Formula 1 are prepared. The precursors can be in the form of oxides, carbonates, nitrates, hydroxides, and chlorides of the respective elements of Formula 1. Those precursor compounds of the respective elements of Formula 1 are mixed in powder form. Then, the obtained powder mixture is sintered for 1 to 10 hours at about 500° C. to 1000° C. in an ambient atmosphere and then the sintered product is further sintered at a temperature of about 700° C. to 1200° C. in a reducing atmosphere that comprises a gaseous mixture of hydrogen and nitrogen. Herein, the amount of hydrogen in the gaseous mixture is controlled to be at least 5 volume percent (vol. %).

By performing the sintering process twice, impurities including moisture, organic material, or a complex compound of some salts contained can be removed and volatile elements can be fixed, i.e., remain in a relatively stable state, in the high processing temperature. When the first sintering temperature is less than 500° C., volatile elements such as alkaline metals may not be sufficiently fixed; on the other hand, when the first sintering temperature is greater than 1000° C., the mixed source may be sublimed, a stoichiometric ratio can be broken, or undesired phases can be formed in the mixed source. Therefore, the wavelength conversion efficiency can be reduced.

When the second sintering temperature is lower than 700° C., synthesis reaction may not be thoroughly performed and intensity of emission is lower than a desired level. On the other hand, when the second sintering temperature is higher than 1200° C., the target product is partly fused and a glass phase is formed, and thus, the intensity of emission is reduced and a powder having desired properties cannot be obtained.

The obtained sintered product can be milled into powder and washed using distilled water to obtain a desired phosphor.

In terms of processibility, a nitride red phosphor is expensive due to its complex synthesis conditions even though it has excellent emission properties. On the other hand, the silicate phosphor is inexpensive because it can be easily prepared using a solid phase reaction method, a coprecipitation method, or a sol-gel method. In an embodiment, when the silicate phosphor is prepared using a solid phase reaction method, optimal synthesis can be achieved at a temperature of about 1000° C. or lower due to its low melting point.

In an embodiment, a white light emitting device includes a UV LED and the silicate phosphor.

In an embodiment, the UV-LED uses electrical waves in the vicinity of ultraviolet rays and near-ultraviolet rays as an exciting light source.

In the white light emitting device, the exciting light source of the UV LED has a wavelength band of 380 to 460 nm.

The white light emitting device can further include one or more phosphors selected from blue phosphors, green phosphors, and red phosphors.

The blue phosphors can be selected from the group consisting of $(Sr,Ba,Ca)_5(PO_4)_3C: Eu^{2+}$; $BaMg_2Al_{16}O_{27}: Eu^{2+}$; $Sr_4Al_{14}O_{25}: Eu^{2+}$; $BaAl_8O_{13}:Eu^{2+}$; $BaMgAl_{10}O_{17}: Eu^{2+}$, $Sr_2Si_3O_8 2SrCl_2: Eu^{2+}$; $Ba_3MgSi_2O_8: Eu^{2+}$; $(Sr,Ca)_{10}(PO_4)_6 \cdot nB_2O_3:Eu^{2+}$; and a combination thereof.

The green phosphors can be selected from the group consisting of $(Ba,Sr,Ca)_2SiO_4: Eu^{2+}$; $Ba_2MgSi_2O_7: Eu^{2+}$; $Ba_2ZnSi_2O_7: Eu^{2+}$; $BaAl_2O_4:Eu^{2+}$; $SrAl_2O_4:Eu^{2+}$; $BaMgAl_{10}O_{17}:Eu^{2+}, Mn^{2+}$; $BaMg_2Al_{16}O_{27}:Eu^{2+}; Mn^{2+}$; and a combination thereof.

The red phosphors can be selected from the group consisting of $CaAlSiN_3:Eu^{2+}$; $Sr_2Si_5N_8:Eu^{2+}$; $(Sr,Ba,Ca)_2P_2O_7: Eu^{2+},Mn^{2+}$; $(Ba,Mg)SiO_4:Eu^{2+},Mn^{2+}$; $(Ba,Ca)Ga_2O_7:Eu^{2+}$, $Mn^{2+}$; $Ba_2MgSi_2O_7:Eu^{2+},Mn^{2+}$; $3.5MgO \cdot 0.5MgF_2 \cdot GeO_4$: $Mn^{4+}$; and a combination thereof.

In the emission spectrum of the silicate phosphor of the white light emitting device including the UV LED, the wavelength of the peak of the silicate phosphor may be in the range of 565 to 600 nm.

In the emission spectrum of the blue phosphor, the wavelength of the peak of the blue phosphor may be in the range of 420 to 480 nm.

In the emission spectrum of the green phosphor, the wavelength of the peak of the green phosphor may be in the range of 510 to 560 nm.

In the emission spectrum of the red phosphor, the wavelength of the peak of the green phosphor may be in the range of 610 to 670 nm.

In an embodiment, a white light emitting device includes a blue LED and the silicate phosphor.

The blue-LED acts as an exciting light source and has a wavelength band of 420 to 480 nm.

In the emission spectrum of the silicate phosphor of the white light emitting device including the blue LED, the wavelength of the peak of the silicate phosphor may be in the range of 560 to 590 nm.

FIG. 1 illustrates the structure of a surface-mounted light emitting device of a polymer lens type according to an embodiment. The polymer lens can be an epoxy lens.

Referring to FIG. 1, a light emitting diode (LED) chip 10 is die-bonded to an electric lead wire 30 through a gold wire 20. The phosphor composition 40 including the phosphor is included in an epoxy mold layer 50. The epoxy mold layer 50 may comprise an epoxy-based resin, which may be a general-purpose resin that is commercially available. The epoxy mold layer 50 containing the phosphor composition 40 is held inside a forming mold 60. In addition, as shown in FIG. 1, the inside of the forming mold 60 is formed of a reflective film coated with aluminum or silver, thereby upwardly reflecting light radiations emitted from the LED chip 10. The inside of the forming mold 60 in this exemplary embodiment is filled with the mixture of phosphor and epoxy.

The epoxy dome lens 70 formed above the epoxy mold layer 50 can have various shapes according to a desired angle of orientation.

The light emitting device is not limited to the structure illustrated in FIG. 1. For example, the light emitting device may have various types of structures, including a phosphor-mounting type, a shell type, a PCB surface mounting type, and so on.

In addition to the light emitting device described above, the silicate phosphor represented by Formula 1 can also be used in other types of devices, for example a lamp such as a mercury lamp, a xenon lamp, or a self-emissive liquid crystalline display device (LCD).

Also, as described above, the silicate phosphor represented by Formula 1 can produce a white light having high color rendering properties. Therefore, the white light emitting device can be usefully used in applications requiring a white illumination having high color rendering index. For example, the white light emitting device can be used in medical applications, food exhibitions, museums, and high-quality lifestyle illumination applications. In addition, the white light emitting device can also be used in a traffic light, a back light of a display device, or a light source of communication devices.

The following examples are for illustrative purposes only and are not intended to limit the scope of the claimed invention.

Example 1

The following experiment was performed using a solid phase reaction method. Source powder including 9.039 g of $Li_2CO_3$, 16.57 g of $SrCO_3$, 6.965 g of $SiO_2$, 0.10 g of $Eu_2O_3$, 0.1 g of $CeO_2$, and 0.045 g of $Al(OH)_3$ was mixed using a mortar for one hour. The mixed powder was loaded into an alumina reaction vessel and heat-treated at 700° C. at an atmospheric condition for 6 hours. The obtained product was mixed using a mortar for 30 minutes, and the obtained mixture was sintered at 1000° C. for 8 hours in a gaseous mixture of $H_2$ and $N_2$ having a volume ratio of 5:95. A phosphor, $Li_2Sr_{0.99}Eu_{0.005}Ce_{0.005}Si_{0.995}Al_{0.005}O_4$ was thereby obtained.

Comparative Example 1

The following experiment was performed using a solid phase reaction method. Source powder including 9.039 g of $Li_2CO_3$, 16.65 g of $SrCO_3$, 7 g of $SiO_2$, and 0.103 g of $Eu_2O_3$ was mixed using a mortar for one hour. The mixed powder was loaded into an alumina reaction vessel and heat-treated at 700° C. under atmospheric conditions for 10 hours. The obtained product was mixed using a mortar for 30 minutes and the obtained mixture was sintered at 1000° C. for 8 hours in a gaseous mixture of $H_2$ and $N_2$ in a ratio of 5:95. A phosphor, $Li_2Sr_{0.995}Eu_{0.005}SiO_4$ was thereby obtained.

Figure 2:
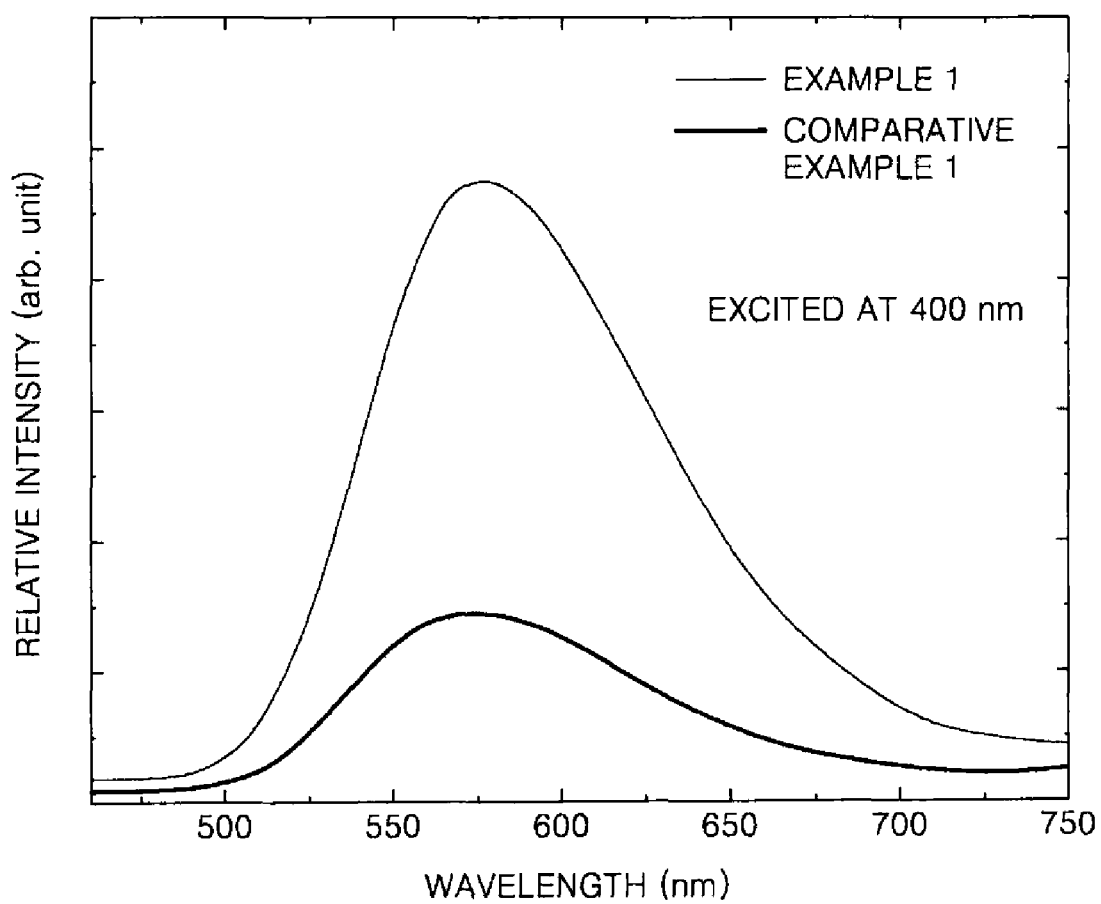
FIG. 2 is a graph showing emission spectra of a silicate phosphor and a comparative silicate phosphor when excited at a wavelength of 400 nm.

FIG. 2 is a graph showing emission spectra of phosphors prepared according to Example 1 and Comparative Example 1 when excited at a wavelength of 400 nm. Referring to FIG. 2, it can be seen that the phosphor prepared according to Example 1 has higher emission efficiency than the phosphor prepared according to Comparative Example 1.

Figure 3:
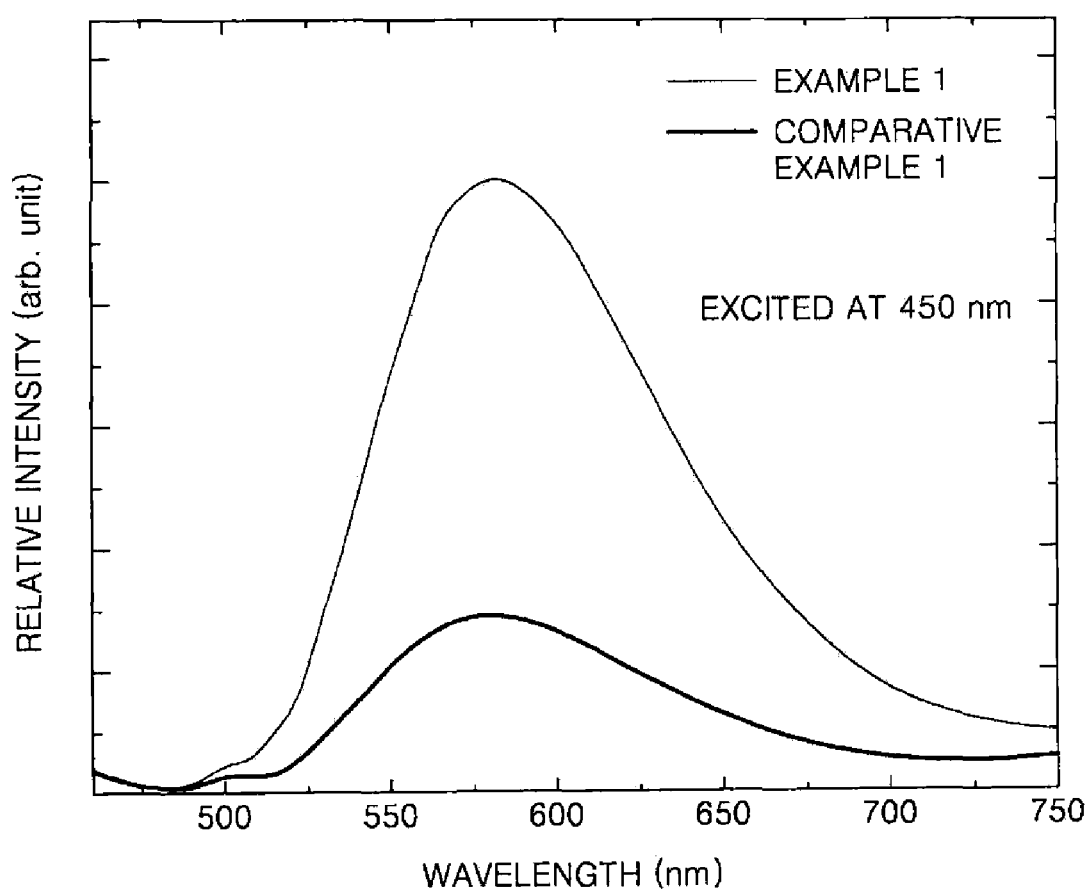
FIG. 3 is a graph showing emission spectra of a silicate phosphor and a comparative silicate phosphor when excited at a wavelength of 450 nm.

FIG. 3 is a graph showing emission spectra of phosphors prepared according to Example 1 and Comparative Example 1 when excited at a wavelength of 450 nm. Referring to FIG. 3, it can be seen that the phosphor prepared according to Example 1 has higher emission efficiency than the phosphor prepared according to Comparative Example 1.

Figure 4:
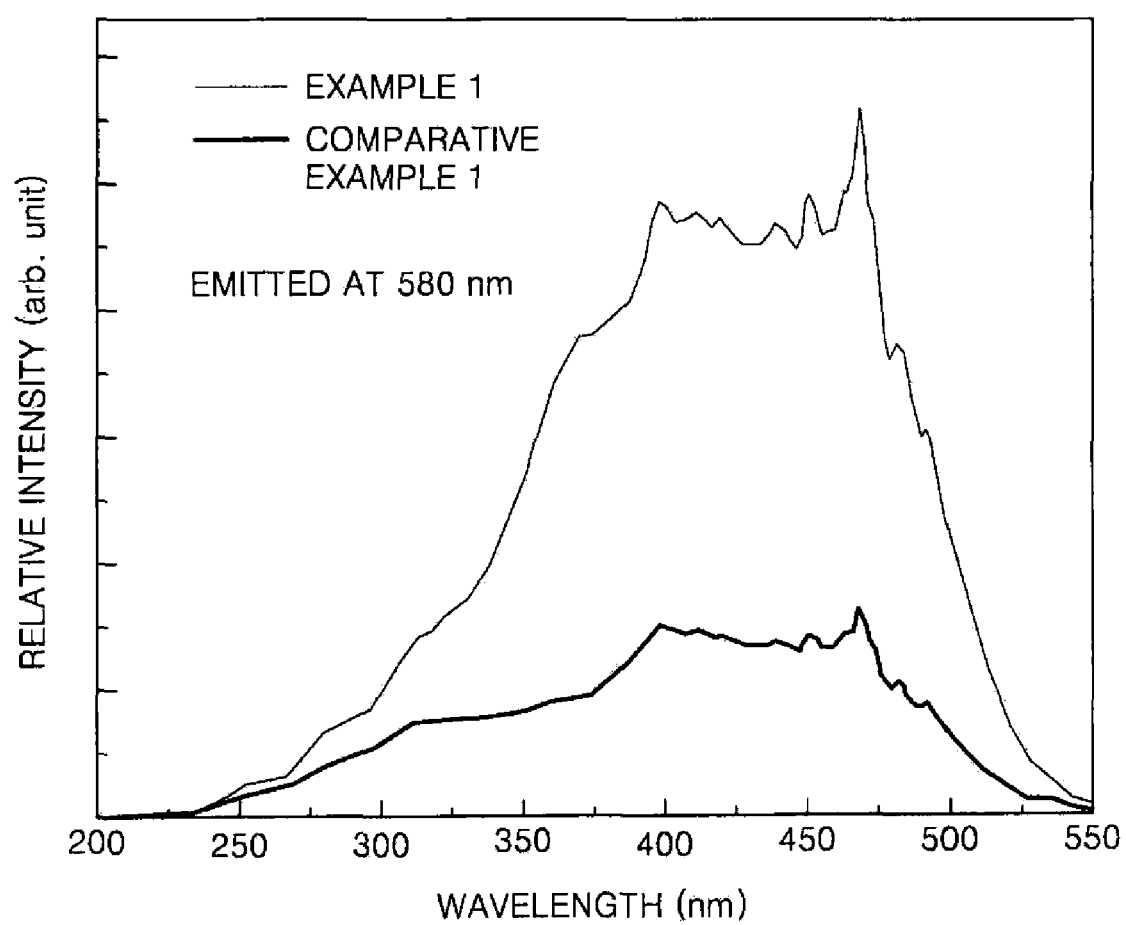
FIG. 4 is a graph showing the absorption spectra of a silicate phosphor and a comparative silicate phosphor.

FIG. 4 is a graph showing absorption spectra of the phosphors prepared according to Example 1 and Comparative Example 1. Referring to FIG. 4, it can be seen that the phosphor prepared according to Example 1 has higher emission efficiency than the phosphor prepared according to Comparative Example 1.

While disclosed embodiments have been shown and described with reference to exemplary embodiments thereof, it will be understood by those of ordinary skill in the art that various changes in form and details may be made therein without departing from the spirit and scope of the present invention as defined by the following claims.

In addition, many modifications can be made to adapt a particular situation or material to the teachings of the invention without departing from the essential scope thereof. Therefore, it is intended that the invention not be limited to the particular embodiments disclosed as the best mode contemplated for carrying out this invention, but that the invention will include all embodiments falling within the scope of the appended claims. Moreover, the use of the terms first, second, etc. do not denote any order or importance, but rather the terms first, second, etc. are used to distinguished one element from another. Furthermore, the use of the terms a, an, etc. do not denote a limitation of quantity, but rather denote the presence of at least one of the referenced item.

What is claimed is:

1. A silicate phosphor represented by Formula 1:

$$Li_{a-x}A_xSr_{b-y-z-l}B_yEu_zC_lSi_{c-m}D_mO_{d-n}E_n \quad \text{(Formula 1)}$$

where A comprises at least one ion selected from the group consisting of Na, K, Rb, and Cs; B comprises at least one ion selected from the group consisting of Mg, Ca, Ba and Zn; C comprises at least one ion selected from the group consisting of Sc, Y, La, Gd, Ce, Pr, Nd, Sm, Tb, Dy, Ho, Er, Tm, Yb, Lu and Bi; D comprises at least one ion selected from the group consisting of B, Al, Ga, In and Tl; E comprises at least one ion selected from the group consisting of F, Cl, Br, and I; where $1.5 \leq a \leq 2.5$; $1.5 \leq b \leq 2.5$ or $b=1$; $1.5 \leq c \leq 2.5$ or $c=1$; $3 \leq d \leq 5$; $0 \leq x < 2$; $0 \leq y < 1$; $0 < z \leq 0.1$; $0 < l \leq 0.1$; and $0 < m \leq 0.1$ and $0 \leq n \leq 1$.

2. The silicate phosphor of claim 1, wherein, in Formula 1, C is Ce and D is Al.

3. The silicate phosphor of claim 1, wherein $0 < z+l \leq 0.05$.

4. A silicate phosphor represented by the Formula: $Li_2Sr_{l-p-q}Eu_pCe_qSi_{l-q}Al_qO_4$ where $0 < p+q \leq 0.05$.

5. A white light emitting device comprising:
a UV light emitting diode (LED); and
the silicate phosphor of claim 1.

6. The white light emitting device of claim 5, wherein the UV-LED emits electrical waves in the vicinity of ultraviolet rays and near-ultraviolet rays as an exciting light source.

7. The white light emitting device of claim 6, wherein the UV LED has a wavelength band of 380 to 460 nm.

8. The white light emitting device of claim 7, further comprising at least one of a blue phosphor, a green phosphor and a red phosphor.

9. The white light emitting device of claim 8, wherein the blue phosphor comprises one or more phosphors selected from the group consisting of $(Sr,Ba,Ca)_5(PO_4)_3Cl:Eu^{2+}$; $BaMg_2Al_{16}O_{27}:Eu^{2+}$; $Sr_4Al_{14}O_{25}:Eu^{2+}$; $BaAl_8O_{13}:Eu^{2+}$; $BaMgAl_{10}O_{17}:Eu^{2+}$, $Sr_2Si_3O_8 \cdot 2SrCl_2:Eu^{2+}$; $Ba_3MgSi_2O_8:Eu^{2+}$ and $(Sr,Ca)_{10}(PO_4)_6 \cdot nB_2O_3:Eu^{2+}$.

10. The white light emitting device of claim 8, wherein the green phosphor comprises one or more phosphors selected from the group consisting of $(Ba,Sr,Ca)_2SiO_4:Eu^{2+}$; $Ba_2MgSi_2O_7:Eu^{2+}$; $Ba_2ZnSi_2O_7:Eu^{2+}$; $BaAl_2O_4:Eu^{2+}$; $SrAl_2O_4:Eu^{2+}$; $BaMgAl_{10}O_{17}:Eu^{2+}$, $Mn^{2+}$; and $BaMg_2Al_{16}O_{27}:Eu^{2+},Mn^{2+}$.

11. The white light emitting device of claim 8, wherein the red phosphor comprises one or more phosphors selected from the group consisting of $CaAlSiN_3:Eu^{2+}$; $Sr_2Si_5N_8:Eu^{2+}$; $(Sr,Ba,Ca)_2P_2O_7:Eu^{2+},Mn^{2+}$; $(Ba,Mg)SiO_4:Eu^{2+},Mn^{2+}$; $(Ba,Ca)Ga_2O_7:Eu^{2+},Mn^{2+}$; $Ba_2MgSi_2O_7:Eu^{2+},Mn^{2+}$ and $3.5MgO \cdot 0.5MgF_2 \cdot GeO_4:Mn^{4+}$.

12. The white light emitting device of claim 8, wherein the peak of the silicate phosphor is in a range of 565 to 600 nm in an emission spectrum of the silicate phosphor; the peak of the blue phosphor is in a range of 420 to 480 nm in an emission spectrum of the blue phosphor; the peak of the green phosphor is in a range of 510 to 560 nm in an emission spectrum of the green phosphor; and the peak of the red phosphor is in the range of 610 to 670 nm in an emission spectrum of the red phosphor.

13. A white light emitting device comprising:
a blue LED; and
the silicate phosphor of claim 1.

14. The white light emitting device of claim 13, wherein the blue LED has a wavelength band of 420 to 480 nm.

15. The white light emitting device of claim 5, wherein the white light emitting device is used in a traffic light, a light source for communication devices, a backlight of a display device, or an illumination application.

16. The white light emitting device of claim 13, wherein the white light emitting device is used in a traffic light, a light source for communication devices, a backlight of a display device, or an illumination application.

* * * * *